United States Patent [19]

McElroy

[11] 4,345,364

[45] Aug. 24, 1982

[54] METHOD OF MAKING A DYNAMIC MEMORY ARRAY

[75] Inventor: David J. McElroy, Houston, Tex.

[73] Assignee: Texas Instruments Incorporated, Dallas, Tex.

[21] Appl. No.: 137,705

[22] Filed: Apr. 7, 1980

[51] Int. Cl.³ .................... H01L 21/22; H01L 21/26
[52] U.S. Cl. ................................ 29/571; 29/576 B; 29/577 C; 148/187
[58] Field of Search .......... 29/571, 576 B, 577 C; 357/23 VT; 148/187

[56] References Cited

U.S. PATENT DOCUMENTS

| | | |
|---|---|---|
| 3,985,591 | 10/1976 | Arita ............................. 148/187 |
| 4,035,820 | 7/1977 | Matzen ........................ 357/23 VT |
| 4,055,444 | 10/1977 | Rao ................................ 148/1.5 |
| 4,129,936 | 12/1978 | Takei .............................. 29/571 |
| 4,240,092 | 12/1980 | Kuo ............................. 357/23 X |
| 4,258,466 | 3/1981 | Kuo et al. ....................... 29/571 |

Primary Examiner—G. Ozaki
Attorney, Agent, or Firm—John G. Graham

[57] ABSTRACT

A dynamic read/write memory cell of the one transistor type is made by a single-level polysilicon process in which the word lines and the gates of the access transistors are formed by the metal strips. No metal-to-silicon or metal-to-polysilicon contacts are needed. The access transistors are made by etching through polysilicon strips which are the capacitor bias plates. The size of the transistor is not determined by alignment accuracy.

11 Claims, 9 Drawing Figures

METHOD OF MAKING A DYNAMIC MEMORY ARRAY

BACKGROUND OF THE INVENTION

This invention relates to semiconductor memory devices and method of manufacture, and more particularly to a one-transistor dynamic read/write memory cell array.

Dynamic read/write memory cells made by the double-level polysilicon N-channel self-aligned process commonly used in the industry are shown in pending U.S. patent applications Ser. No. 648,594, filed Jan. 12, 1976 and Ser. No. 722,841, filed Sept. 13, 1976, by C-K Kuo now U.S. Pat. No. 4,240,042, both assigned to Texas Instruments, as well as in Electronics, Feb. 19, 1976, pp. 116–121, May 13, 1976, pp. 81–86, and Sept. 28, 1978, pp. 109–116.

Although the double-level polysilicon process has proved to be quite successful and many hundreds of millions of memory devices have been made in this way, there is nevertheless added cost and degradation in yield due to the additional process steps compared to a single level process. Further, the classic cell layout uses a transistor which has a channel length determined by the amount of overlap of the two poly levels, making the characteristics of the transistor difficult to control. Another problem is the necessity of making metal-to-polysilicon contacts to connect the row lines to the gate.

It is the principal object of this invention to provide an improved dynamic read/write memory cell. Another object is to provide a dynamic memory of small cell size. An additional object is to provide a dense array of dynamic memory cells, made by a more efficient method. A further object is to provide an improved way of making dynamic memory cells without using metal-to-polysilicon contacts in the array. Another object is to avoid relying upon alignment precision in defining transistor channel lengths in dynamic memory cells.

SUMMARY OF THE INVENTION

In accordance with an illustrative embodiment of the invention a dynamic read/write memory cell of the one transistor type is made by a single-level polysilicon process in which the word lines and the gates of the access transistors are formed by metal strips. No metal-to-silicon or metal-to-polysilicon contacts are needed. The access transistors are made by etching through polysilicon strips which are the capacitor bias plates. The size of the transistor is not determined by alignment accuracy.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
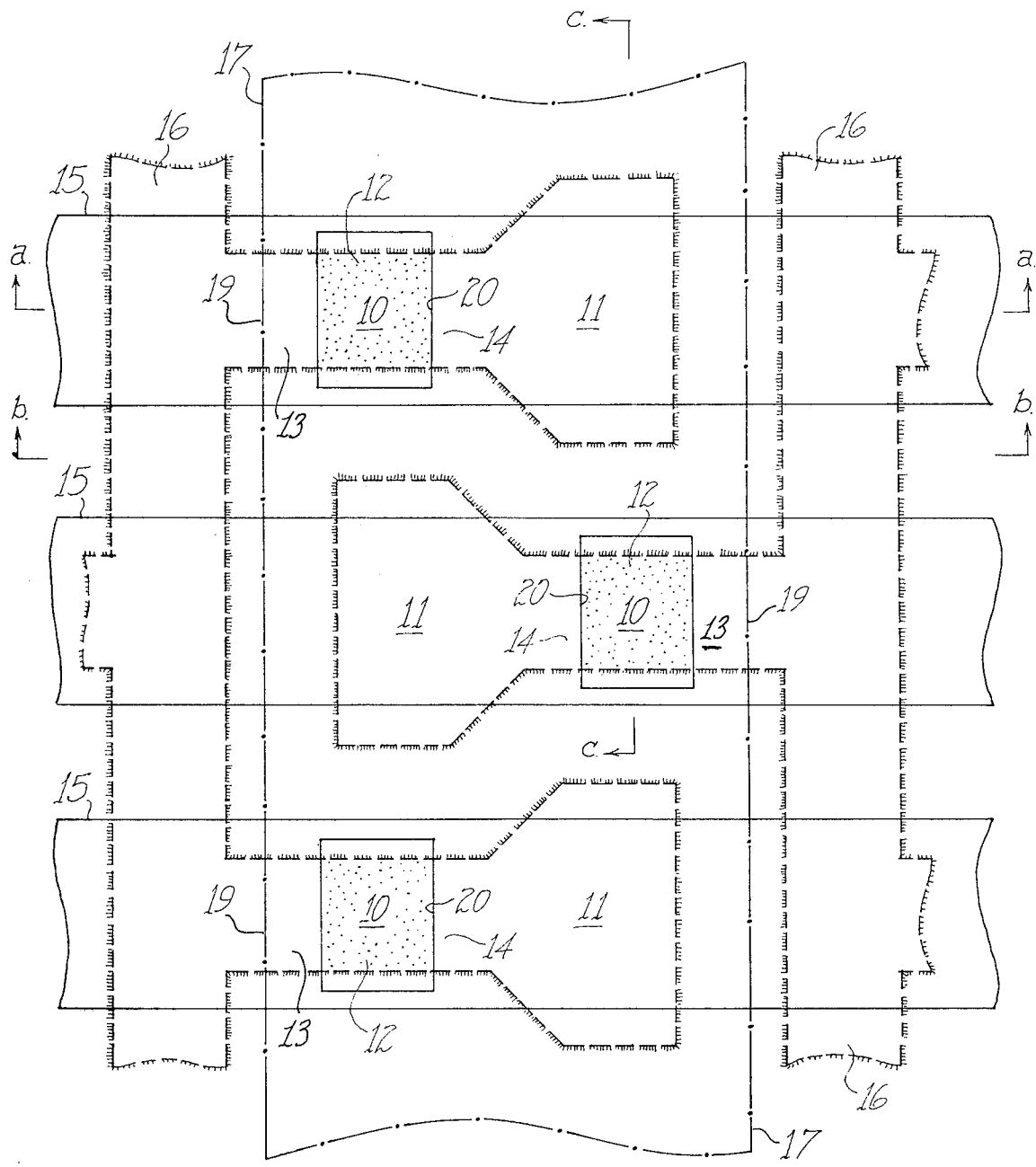
FIG. 1 is a greatly enlarged plan view of a small portion of a semiconductor chip showing the physical layout of a part of a dynamic memory cell array employing cells made according to the invention.
Figure 2:
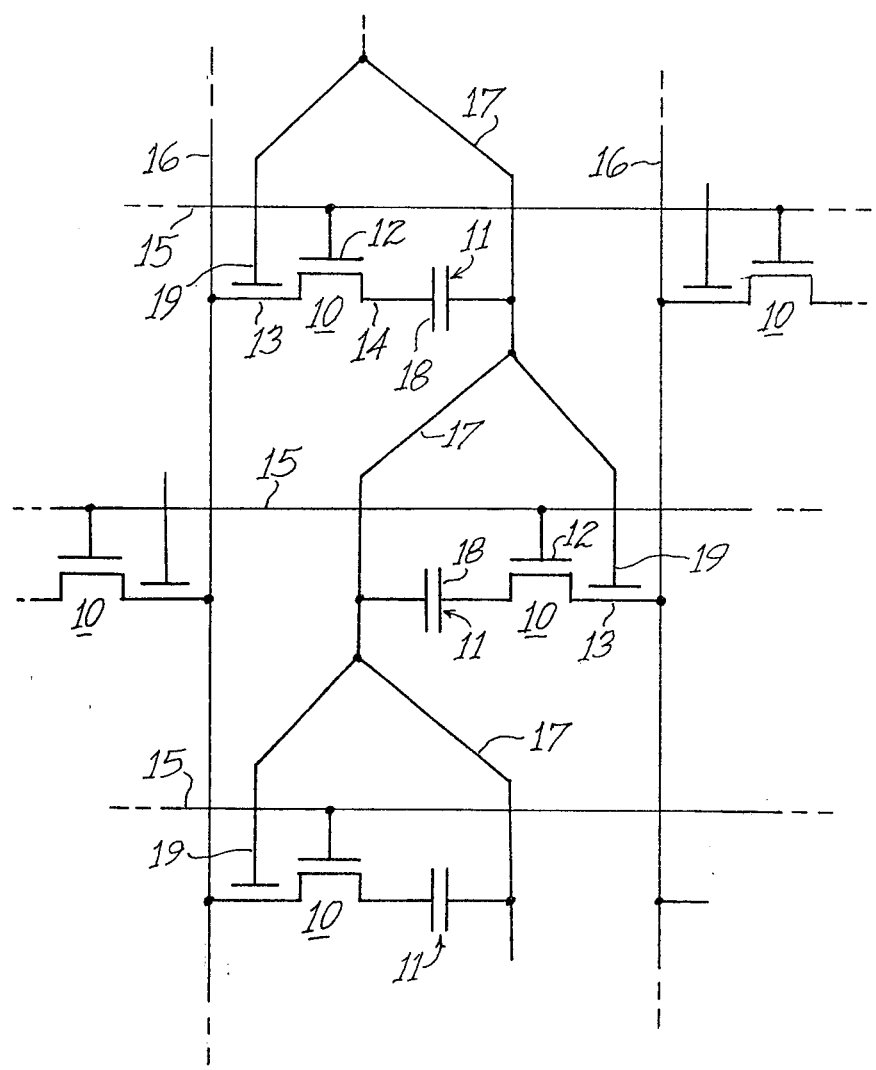
FIG. 2 is an electrical schematic diagram of the part of the cell array of FIG. 1.
Figure 3:
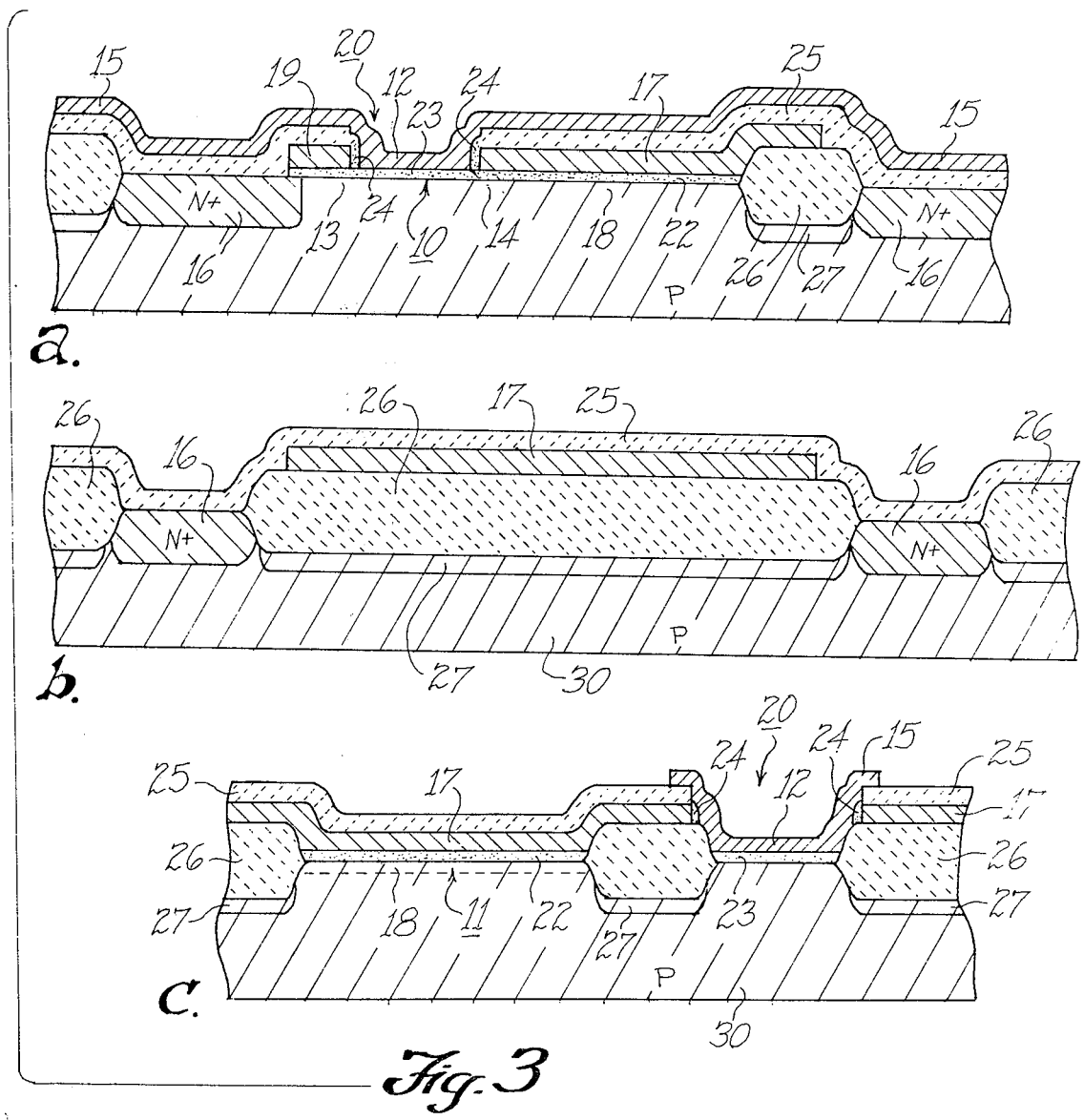
FIGS. 3a–3c are elevation views in section of the cells of FIG. 1, taken along the lines a—a, b—b, and c—c, respectively.

With reference to FIGS. 1, 2, and 3a–3c, a one-transistor dynamic memory cell is illustrated which is made according to the invention. The array consists of a large number of cells, each with an access transistor 10 and a capacitor 11. The access transistor 10 has a gate 12, a source 13 and a drain 14. The gates 12 are parts of elongated metal strips 15 which are the X or word address lines for the array. The sources 13 are inverted surface regions connected to N+ diffused moat regions 16 which are the bit lines or Y output lines. The capacitors 11 include a first level polysilicon bias gate 17 which is part of an elongated strip of polysilicon extending along the entire array and connected to the Vcc supply, ordinarily +5 V. The lower plates of the capacitors 11 are created by inverted regions 18 beneath the strip 17. The source region 13 is also inverted by the voltage on the segment 19 of the strip 17. The transistors 10 are formed in holes 20 in the strip 17.

A thin gate oxide layer 22 separates the first level polysilicon bias strip 17 from the silicon surface, and thin gate oxide layer 23 separates the metal gate 12 from the silicon; an oxide coating 24 separates the metal line 15 from the polysilicon 17 and 19 in each cell. A thick layer 25 of low temperature deposited oxide overlies the upper surface of the bar. A thick thermal field oxide coating 26 covers parts of the bar not occupied by the transistors or diffused interconnects (moat regions), and P+ channel stop regions 27 are formed underneath all the thick field oxide.

The array is formed on a silicon bar 30 which would typically contain perhaps 64K or 256K bits on a bar less than 200 mils on a side or 40,000 square mil area, depending upon the bit density. The three cells shown would be on a minute part of the bar perhaps about one mil wide. A 64K cell array would require 256 of the metal X address lines 15 and 256 of the N+ diffused Y lines 16, providing 65,536 bits.

Turning now to FIGS. 4a–4d, a process for making the cell array according to the invention will be described. The starting material is a slice of P-type monocrystalline silicon, typically four inches in diameter and twenty mils thick, cut on the <100> plane, of a resistivity of about 6 to 8 ohm-cm. As mentioned above, in the FIGURES the portion shown of the bar 30 represents only a very small part of the slice, perhaps one or two mils wide. After appropriate cleaning, the slice is oxidized by exposing to oxygen in a furnace at an elevated temperature of perhaps 1100° C. to produce an oxide layer 31 over the entire slice of a thickness of about 1000 Å. Next, a layer 32 of silicon nitride of about 1000 Å thickness is formed over the entire slice by exposing to an atmosphere of dichlorosilane and ammonia in a reactor. A coating of photoresist is applied to the entire top surface of the slice, then exposed to ultraviolet light through a mask which defines the desired pattern of the thick field oxide 26 and the P+ channel stops 27. The resist is developed, leaving areas where nitride is then removed by etching the exposed part of the nitride layer 32 but leaving in place the oxide layer 31.

Using photoresist and nitride as a mask, the slice is subjected to an implant step to produce the channel stop regions; to this end boron atoms are introduced by ion implant into unmasked regions 33 of silicon. The regions 33 will not exist in the same form in the finished device, because silicon is consumed in the field oxidation procedure. Usually the slice is subjected to a heat treatment after implant, prior to field oxide growth, as set forth in U.S. Pat. No. 4,055,444, assigned to Texas Instruments.

Figure 4:
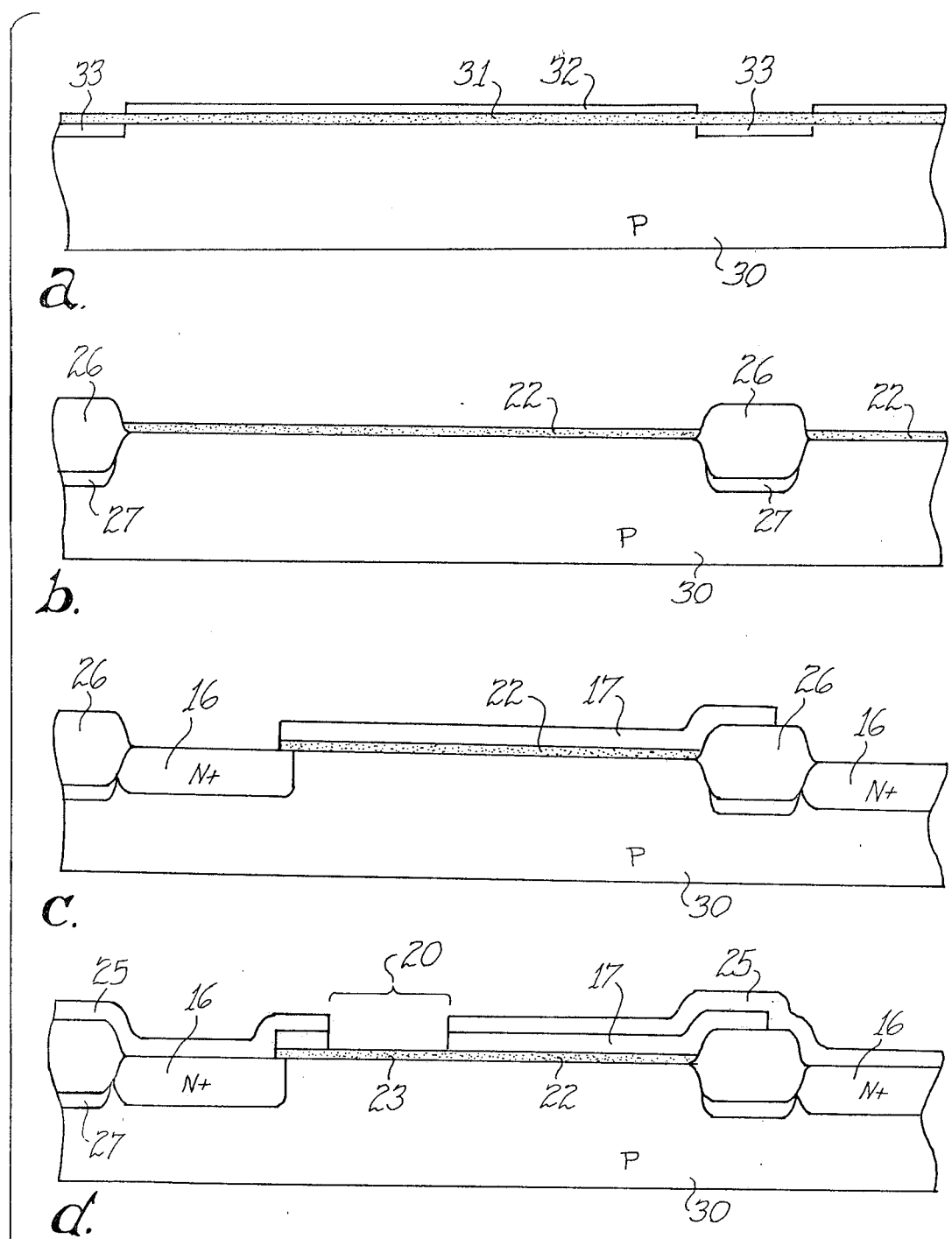
FIGS. 4a–4d are elevation views in section of the cell arrays of FIGS. 1 and 3a–3c, at successive stages in the manufacturing process, taken generally along the line a—a in FIG. 1.

The next step in the process is the formation of field oxide 26 by subjecting the slices to steam or an oxidizing atmosphere at about 1000° C. for several hours. This causes a thick field oxide layer 26 to be grown as seen in FIG. 4b, extending into the silicon surface as silicon is consumed, with the remaining part of the nitride layer 32 masking oxidation. The thickness of this layer 26 is about 10,000 Å, part of which is above the original surface and part below. The boron doped P+ regions 33 formed by implant are partly consumed, but also diffuse further into the silicon ahead of the oxidation front to produce P+ field stop regions 27 which are much deeper than the original regions 33.

Next the remaining nitride layer 32 is removed by an etchant which attacks nitride but not silicon oxide, then the oxide 31 is removed by etching and the exposed silicon cleaned. The oxide layer 22 is grown by thermal oxidation to a thickness of about 500 Å.

As seen in FIG. 4c a layer of polycrystalline silicon is deposited over the entire slice in a reactor using standard techniques to a thickness of about 8000 Å. This polysilicon layer is patterned by applying a layer of photoresist, exposing to ultraviolet light through a mask prepared for this purpose, developing, then etching the exposed polysilicon to define the strip 17. An arsenic implant or a phosphorus diffusion is now performed to dope the strips 17 and create the N+ bit lines 16, using the polysilicon strips 17 as a mask.

A thick layer 25 of silicon oxide is deposited over the entire slice by decomposition of silane at a low temperature, about 400° C. This layer 25 insulates the metal level from the layer of polycrystalline silicon and other areas of the face of the bar, and is referred to as multilevel oxide.

Referring to FIG. 4d the multilevel oxide layer 25 is now patterned by a photoresist operation which exposes the windows or holes 20 for the metal gates along the word lines 15 in the cell array. Using the photoresist as an etch mask, the thick oxide 25 is etched away to the polysilicon, then using plasma etching the polysilicon is removed down to the thin thermal oxide. It is preferable that the original thin oxide be left in place, rather than etching through to silicon. A thermal oxidation step at about 800° C. in steam now produces the coating 24 on the sidewalls; the heavily doped poly 17, 19 will oxidize much faster than the silicon covered by hard thermal oxide 23, so the gate oxide thickness will not increase very much during this step.

The metal word lines 15 and gates 12 are formed next. Metal contacts and interconnections are also used in the periphery of the chip in the input buffers, decoders, sense amplifiers, and the like, as well as for the bonding pads which provide connection to external electrodes. The metal lines, gates, contacts and interconnections are made in the usual manner by depositing a thin film of aluminum over the entire top surface of the slice then patterning it by a photoresist mask and etch sequence, leaving the metal strips 15, gates 12, and other metal elements.

A protective overcoat (not shown) is then deposited and patterned to expose the bonding pads, and the slice is scribed and broken into individual bars which are packaged in the customary manner.

It is important to note that the alignment of the mask which creates the windows 20 is not critical. The windows may move to the left in FIGS. 1 and 3a to the edge of the strip 17 with no effect on transistor characteristics, or likewise move to the right with no significance other than a small change in the size of the capacitor 11.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A method of making a dynamic semiconductor memory cell of the one-transistor type having a capacitor and a transistor comprising the steps of:
    applying a layer of conductive material on a face of a body of semiconductor material overlying and separated from a first area of the face by a thin insulator,
    forming a heavily doped region in said face aligned with an edge of said layer and adjacent said first area, the heavily doped region being of conductivity-type opposite that of semiconductor material beneath it,
    applying an insulator coating on said face over said layer,
    opening a window in said insulator coating and in said layer over a part of said first area, and
    applying a conductive strip on said face over said coating and extending into said window to form a gate of said transistor.

2. A method according to claim 1 wherein the semiconductor body is P-type silicon, the heavily doped region is N+, and the conductive material is polycrystalline silicon.

3. A method according to claim 2 wherein said layer is patterned to define a bias gate for a capacitor which will partially underlie the conductive strip.

4. A method according to claim 3 wherein said conductive strip is metal and said coating separates said metal from said face except at said window where a thin gate oxide underlies the metal.

5. A method according to claim 4 wherein a coating of thick thermal field oxide is formed on said face before applying said layer, except in the capacitor and transistor area and over what will be the heavily doped region.

6. A method according to claim 5 wherein an array of rows and columns of said cells is formed at said face, and the metal includes a plurality of parallel strips of metal, each strip forming the gates for a plurality of cells in a row.

7. A method according to claim 1 wherein said window is laterally spaced along the face away from both edges of said layer.

8. A method of making a semiconductor device comprising the steps of:

applying a layer of conductive material over a face of a semiconductor body to form an electrode overlying a first semiconductor region, forming a doped region in said face in a second region adjacent said first region aligned with an edge of the layer, the doped region being of conductivity-type opposite that of semiconductor material beneath it, applying an insulator coating on said face over said layer, opening a window in said insulator coating and in said layer over a part of said first semiconductor region, and applying a conductive strip to said face extending into said window but not contacting said first semiconductor region.

9. A method according to claim 8 wherein the conductive material is polycrystalline silicon and a thin insulator separates said strip from the face in said window.

10. A method according to claim 9 wherein the conductive strip is metal and the step of applying includes patterning the metal to define an elongated metallic strip forming a transistor gate at said window.

11. A method according to claim 10 wherein the step of patterning the metal includes leaving a plurality of elongated strips as row lines for an array of rows and columns of cells.

* * * * *